(12) United States Patent
Tamura

(10) Patent No.: US 9,583,314 B2
(45) Date of Patent: Feb. 28, 2017

(54) PLASMA PROCESSING APPARATUS

(71) Applicant: Hitachi High-Technologies Corporation, Minato-ku, Tokyo (JP)

(72) Inventor: Hitoshi Tamura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/846,739

(22) Filed: Sep. 5, 2015

(65) Prior Publication Data

US 2016/0141151 A1    May 19, 2016

(30) Foreign Application Priority Data

Nov. 17, 2014    (JP) .................................. 2014-232306

(51) Int. Cl.
| | |
|---|---|
| *H01J 7/24* | (2006.01) |
| *H01J 37/32* | (2006.01) |
| *H01J 37/02* | (2006.01) |
| *H01P 5/103* | (2006.01) |

(52) U.S. Cl.
CPC ........ *H01J 37/32229* (2013.01); *H01J 37/02* (2013.01); *H01J 37/32256* (2013.01); *H01J 37/32293* (2013.01); *H01J 37/32311* (2013.01); *H01P 5/103* (2013.01)

(58) Field of Classification Search
CPC .................................. H01J 37/32; H01J 37/34
USPC ............. 315/111.21; 118/723 E; 156/345.38, 156/345.42, 345.46
See application file for complete search history.

(56) References Cited

U.S. PATENT DOCUMENTS

| | | | | |
|---|---|---|---|---|
| 6,908,530 | B2 * | 6/2005 | Huang | H01J 37/32229 118/723 MW |
| 7,169,255 | B2 * | 1/2007 | Yasui | H01J 37/32174 118/723 E |
| 8,366,833 | B2 * | 2/2013 | Makino | H01J 37/32706 118/723 E |
| 9,418,822 | B2 * | 8/2016 | Kaneko | H01J 37/32935 |
| 2004/0261717 | A1 | 12/2004 | Ishii et al. | |

(Continued)

FOREIGN PATENT DOCUMENTS

| | | |
|---|---|---|
| JP | 2-230728 A | 9/1990 |
| JP | 2003-110312 A | 4/2003 |

(Continued)

*Primary Examiner* — Tung X Le
(74) *Attorney, Agent, or Firm* — Miles & Stockbridge P.C.

(57) ABSTRACT

Provided is a plasma processing apparatus including: a circular waveguide connected with a vacuum vessel, and through which a circularly polarized wave of an electric field for plasma formation propagates; a processing chamber which is arranged below the circular waveguide, and in which plasma is formed; a circularly polarized wave generator, which is arranged in the waveguide; a circularly polarized wave adjuster which is connected with the circular waveguide below the circularly polarized wave generator; a circularly polarized wave detector which is below the circularly polarized wave adjuster; and a controller which adjusts an operation of the circularly polarized wave adjuster according to an output from the circularly polarized wave detector, in which the circularly polarized wave adjuster adjusts a length of a protrusion of a dielectric stub into the circular waveguide based on a signal from the controller.

8 Claims, 9 Drawing Sheets

(56) References Cited

U.S. PATENT DOCUMENTS

2006/0124244 A1* 6/2006 Ishii .................. H01J 37/32192
156/345.42

FOREIGN PATENT DOCUMENTS

| JP | 2011-77292 A | 4/2011 |
| JP | 2011-176146 A | 9/2011 |

* cited by examiner

PLASMA PROCESSING APPARATUS

BACKGROUND OF THE INVENTION

The present invention relates to a plasma processing apparatus that processes a substrate-like sample such as a semiconductor wafer arranged in a processing chamber in a vacuum vessel using plasma formed in the processing chamber, and relates to a plasma processing apparatus in which an electric field propagating in a waveguide arranged above the vacuum vessel is introduced into the processing chamber to form the plasma.

As an apparatus that produces a semiconductor integrated circuit element (a semiconductor device) from a substrate-like sample such as a semiconductor wafer, the above-described plasma processing apparatus has been conventionally used. In a process of manufacturing such a semiconductor wafer, miniaturization of the element has been advanced in order to achieve a request such as improvement of performance of the element and cost saving.

In the conventional miniaturization of the semiconductor devices, the number of elements that can be manufactured per one sheet of the semiconductor wafer is increased by two-dimensionally miniaturizing a structure of the circuit of the device to reduce the cost required for manufacturing one element, while improvement of performance such as a decrease in a required time for the device to calculate or input/output signals, or power consumption has been plotted by shortening a wire length. However, it is said that such the two-dimensional miniaturization of the structure of the circuit of the device has been approaching the limit and other technologies such as an application of a new material or a three-dimensional element structure have been under development in recent years. Meanwhile, with such the change of the material or the structure of the circuit, difficulty in manufacturing semiconductor devices is increased, and an increase in the manufacturing cost becomes a serious problem.

Therefore, to achieve cost saving in manufacturing, an expansion in a diameter of the semiconductor wafer used in manufacturing of the device from 300 mm to 450 mm has been considered. An area of the wafer having the diameter of 450 mm is 2.25 times the area of the wafer having the diameter of 300 mm and, as a result of the fact that a larger number of wafers can be manufactured, the manufacturing cost per one device can be reduced assuming the manufacturing cost per one sheet is equivalent.

In realizing the manufacturing of the device using the semiconductor wafer having such a large area, a technology that realizes uniform processing of the semiconductor wafer in a larger region than before is required for the plasma processing apparatus. Especially, a decrease in non-uniformity in a radial direction and a circumferential direction of plasma formed in the processing chamber, which should be made larger to accommodate the semiconductor, wafers having a larger diameter, is required.

Technologies using a circularly polarized wave as an electric field for forming plasma to decrease such non-uniformity of distribution of density and intensity of the plasma in the processing chamber are conventionally known. As examples of such conventional technologies, technologies disclosed in JP-A-2011-077292 and JP-A-2011-176146 are known.

In these prior-art documents, a circularly polarized wave generator is disclosed, which can optimally adjust an axial ratio of a circularly polarized wave, even if a reflection wave is returned to the circularly polarized wave generator from the plasma having a change in its characteristic due to a change in a voltage, or the density or the intensity of the plasma that is a dielectric as a load formed in the processing chamber, corresponding to the change. Here, the axial ratio of the circularly polarized wave means a ratio of a minimum value to a maximum value of an electric field of a circularly polarized wave, which rotates during one cycle period of the circularly polarized wave of a specific frequency. Further, JP-A-2011-077292 discloses that a monitor unit which detects an axial ratio of a circularly polarized wave is provided and the axial ratio of the circularly polarized wave is optimally adjusted according to an output from the monitor unit.

Further, JP-A-2003-110312 discloses an invention in which a matching box is arranged on a waveguide path (a waveguide) between a circularly polarized wave generator and a processing chamber so that the reflection wave originated as being emitted from an end portion of the waveguide, then being reflected on the processing chamber side, and being returned to the waveguide is prevented from entering the circularly polarized wave generator; it discloses that prevention of the reflection wave by the matching box can prevent deterioration of the axial ratio of the circularly polarized wave.

Further, JP-A-H02-230728 discloses a technology in which a plurality of rod-like members made of a conductor, insertion lengths of which into a circular waveguide are variably adjustable are arranged and the distribution of the electric field in the processing chamber is adjusted by appropriately adjusting the insertion lengths of these rod-like members, so that non-uniformity of distribution of an etching rate of a sample is decreased. Especially, this prior-art document discloses that conductor rods inserted at a plurality of different locations with respect to a traveling direction of the microwave are provided in an axial direction of the circular waveguide and reflection of the electric field traveling from the waveguide to the processing chamber on the processing chamber side is suppressed, so that the non-uniformity of processing can be improved.

SUMMARY OF THE INVENTION

In the above-described prior art, problems have been posed because consideration to the following aspects is insufficient. That is, the circularly polarized wave generators disclosed in JP-A-2011-077292 and JP-A-2011-176146 have a characteristic of having a large adjustment range of characteristics and being able to generate a circularly polarized wave corresponding to a wide range of processing conditions. However, in the invention of JP-A-2011-077292 its size becomes large. Further, in JP-A-2003-110312, with regard to the technology that arranges a matching box toward a plasma processing chamber around a circularly polarized wave generator, because the matching box is needed to be configured by arranging a plurality of matching elements in the traveling direction of the microwave, there is a problem of an increase in a size of the apparatus.

The present inventors have measured a ratio (an axial ratio) of intensities of the electric fields in two direction axes perpendicular to the traveling direction of the circularly polarized wave formed in the waveguide and, as a result, it has been found that a change of the axial ratio accompanying a change of a condition for processing a sample in the processing chamber is relatively small, and thus it is necessary to adjust the axial ratio of the circularly polarized wave with high accuracy in order to decrease the non-uniformity of the processing. In JP-A-2011-077292 and JP-A-2011-176146, although the adjustable range is large, there is a problem that the axial ratio of the circularly polarized wave changes substantially with respect to the position of a dielectric plate, which configures a ceiling member of a vacuum vessel above the processing chamber and allows the electric field supplied from an end portion of the waveguide to the processing chamber to transmit, or an amount of insertion of a stub made of a conductor, which is arranged on the waveguide and inserted into the waveguide, and thus adjustment to an optimum axial ratio with high accuracy becomes difficult.

Furthermore, in JP-A-2003-110312, the matching box arranged on the processing chamber side of the circularly polarized wave generator includes a plurality of stubs and branch waveguides, and the like, and suppresses the reflection wave reflected from plasma, which acts as a dielectric in the processing chamber, and returning in the direction of the circularly polarized wave generator; the axial ratio between the output port of the circularly polarized wave generator and then input port of the matching box is improved by the action of the matching box. However, there is a possibility of deterioration of the axial ratio of the circularly polarized wave at the output side of the matching box depending on the amounts of protrusion of the stubs of the matching box, for example.

Namely, there is a possibility of deterioration of the axial ratio at the output side of the matching box even if a circularly polarized wave having a high axial ratio is generated between the circularly polarized wave generator and the matching box. In this case, the circularly polarized wave having a deteriorated axial ratio is put into the plasma processing chamber, and thus the original object of improvement of uniformity cannot be achieved. Moreover, since there are no measures that monitor the axial ratio of the circularly polarized wave at the output side of the matching box, there is a problem that, even when the axial ratio is deteriorated, it cannot be detected.

The prior art described in JP-A-H02-230728 intends to improve the uniformity of the etching processing using plasma formed in the processing chamber as an electric field is introduced by adjusting distribution of the electric field of a microwave with the rod-like members made of a conductor which are variably adjustable in the lengths of insertion into the waveguide. However, with the description of this prior art, a causal relationship between the insertion lengths of the rod-like members and the etching uniformity is not clear and, particularly, an optimum amount of adjustment of the plurality of rod-like members or criteria of the adjustment for obtaining desired plasma or processing results have not been taken into consideration; therefore, there are problems that labor and time are required in adjustment of the insertion lengths of rod-like members which can yield an expected processing profile of a structure of a circuit on the wafer in a manufacturing process of a semiconductor device, or a product cannot be obtained by appropriately handling a change of a specification such as a film structure of the wafer to be processed.

Therefore, there is a concern that a desired processing profile of a sample such as a wafer cannot be obtained in the manufacturing of semiconductor devices, and a yield of the processing is deteriorated. Such problems have not been taken into consideration in the above-described prior art.

An object of the present invention is to provide a plasma processing apparatus that decreases non-uniformity of distribution of plasma in a processing chamber to improve a yield of processing.

The above-described object is achieved by a plasma processing apparatus including a waveguide which is connected with a vacuum vessel, and through which an electric field for plasma generation propagates; a generator of the electric field which is connected to the waveguide; a circular waveguide which configures the waveguide and is arranged between the generator of the electric field and the vacuum vessel, which has a circular cross-section, and through which a circularly polarized wave of the electric field propagates; a processing chamber which is arranged in the vacuum vessel below the circular waveguide, and inside of which the electric field is supplied and the plasma is generated; a circularly polarized wave generator which is arranged in the waveguide; a circularly polarized wave corrector which is arranged to be connected to the circular waveguide below the circularly polarized wave generator, and which is configured to adjust distribution of the circularly polarized wave in the circular waveguide; a circularly polarized wave detector which is configured to detect the distribution of the circularly polarized wave in the circular waveguide below the circularly polarized wave corrector, in which the circularly polarized wave corrector comprises a plurality of the dielectric stubs inserted in a direction perpendicular to an axis of the circular waveguide; and a controller which is configured to adjust an operation of the circularly polarized wave corrector according to an output from the circularly polarized wave detector, and based on a signal from which the circularly polarized wave corrector is configured to adjust a length of each said dielectric stub to protrude into the circular waveguide.

The plasma processing apparatus can further include a matching unit which is arranged between the circularly polarized wave corrector on the waveguide and the generator of the electric field.

The axial ratio of a circularly polarized wave can be controlled with high accuracy in the vicinity of an optimum value and, therefore, there is an advantageous effect to easily secure the uniformity of the plasma processing. Furthermore, the apparatus is small in size and, therefore, there is an advantageous effect to easily implement it to an existing plasma processing apparatus.

Also, even when a condition of a processing is changed, the axial ratio of a polarized wave is adjusted to obtain a desired result according to the changed condition and, therefore, there is an advantageous effect to secure high uniformity in wide processing conditions. Furthermore, even if there is a reflection wave from inside the processing chamber against the power of the electric field for forming plasma in the processing chamber, the axial ratio of the circularly polarized wave is optimally controlled and high uniformity can be obtained. A unit that detects distribution of the circularly polarized wave is provided and a deviation from a perfect circularly polarized wave can be detected so that, to make the deviation zero, a microwave adjusted for a perfect circularly polarized wave can be stably supplied to the plasma processing chamber.

Other objects, features, and advantages of the invention will become apparent from the following description of the embodiments of the invention taken in conjunction with the accompanying drawings.

DESCRIPTION OF THE EMBODIMENTS

Embodiments of the present invention are described below while making reference to the drawings.

Figure 1:
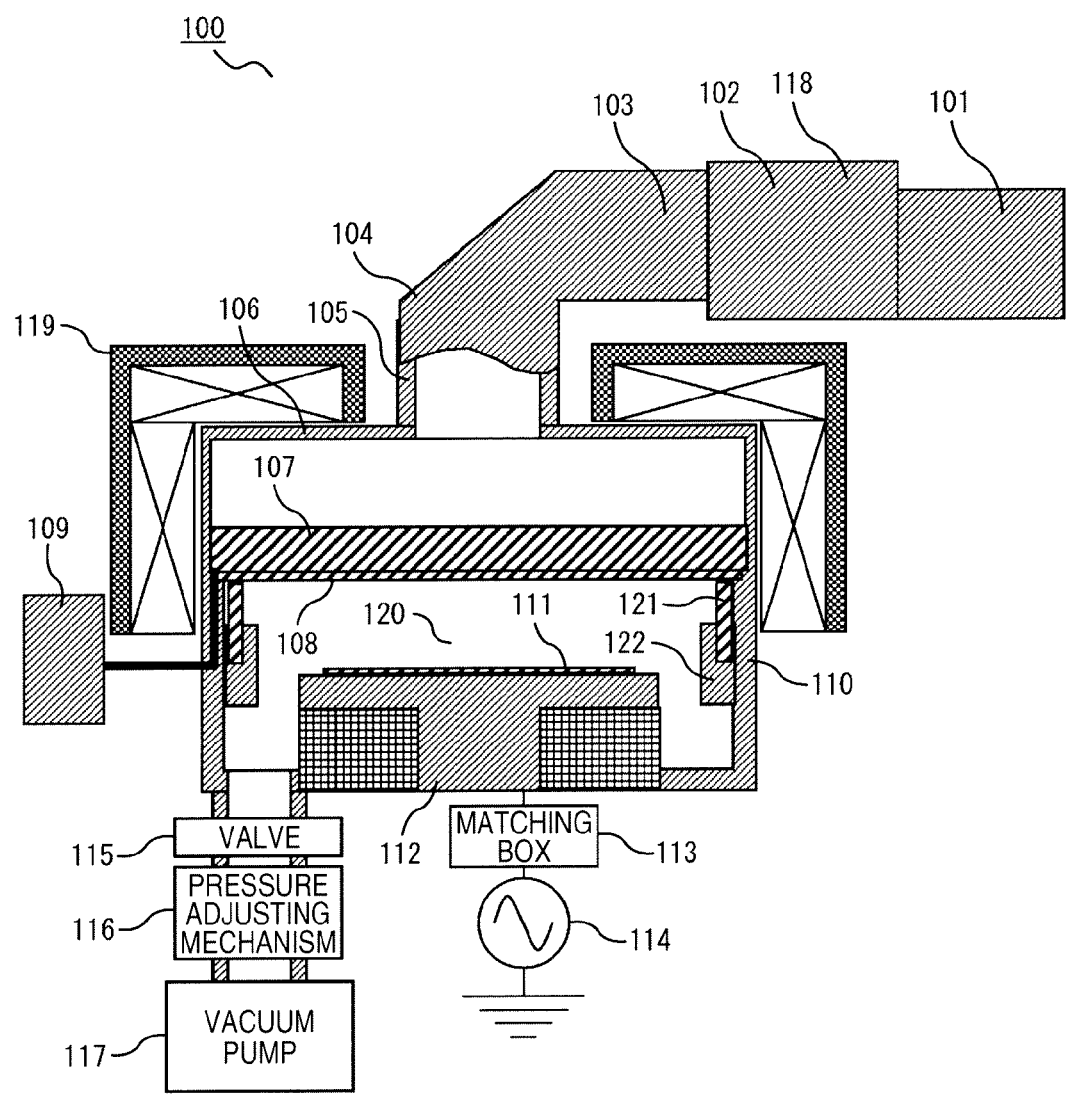
FIG. 1 is a longitudinal sectional view schematically illustrating an outline of a configuration of a plasma processing apparatus according to an embodiment of the present invention.

An embodiment of the present invention is described using FIGS. 1 to 10B. FIG. 1 is a longitudinal sectional view schematically illustrating an outline of a configuration of a plasma processing apparatus according to an embodiment of the present invention. In the present embodiment, one in which an electric field for forming plasma is microwave is adopted as an example of the plasma processing apparatus, and a plasma etching apparatus which etches a sample such as a semiconductor wafer arranged in a processing chamber using the plasma is described.

A plasma processing apparatus 100 illustrated in FIG. 1 roughly includes a vacuum vessel 110 which has a processing chamber 120 that is a space inside of which a semiconductor wafer (hereinafter, wafer) 111 as a sample is arranged and plasma is formed, a plasma forming device which is arranged thereabove and includes a waveguide that allows an electric field that forms plasma to propagate inside, and an exhaust device which is located below the vacuum vessel and coupled therewith and includes a vacuum pump 117 that communicates with an inside of the processing vessel to evacuate and depressurize the inside of the processing chamber.

The vacuum vessel 110 of the present embodiment includes inside the processing chamber 120 having a cylindrical shape which is air-tightly sectioned, and a side wall member of the vacuum vessel 110 surrounding an outer periphery of the processing chamber 120 also has a cylindrical shape or an approximating shape that can be regarded as it is. An upper end of the side wall of the cylindrical shape of the vacuum vessel 110 is in contact with a window member 107 having a disk-like shape and made of a dielectric such as quartz, which functions as a lid that configures an upper portion of the vacuum vessel 110 and divides an inside and an outside; a seal member (not illustrated) such as an O ring is sandwiched between the upper end described above and a side wall or a lower surface of an outer peripheral edge portion of the window member 107, so that the outside and the inside are air-tightly divided.

A space of the divided inside of the vacuum vessel 110 is adopted as the processing chamber 120 in which plasma is formed and the wafer 111 arranged inside is processed using the plasma, and a sample stage 112 having a cylindrical shape on which the wafer 111 is placed and adsorbed to be held by static electricity, is arranged in a lower portion of the processing chamber 120. Also, an exhaust port, that is an opening through which an inlet of the vacuum pump 117 is communicated and gas or particles inside the processing chamber 120 are discharged, is arranged below an upper surface of the sample stage 112 and in a bottom surface of the processing chamber 120.

Inside the processing chamber 120 positioned above the upper surface of the sample stage 112, an inner tube member 121 is provided, which is a member made of quartz, arranged to cover the side wall of the vacuum vessel 110 that surrounds an outer periphery of the processing chamber 120 having a cylindrical shape from the processing chamber 120 side and having a cylindrical shape so that its center axis is positioned to be concentric with the cylindrical portion of the processing chamber 120 or positioned at an approximating location that can be regarded as it is, and having its cross-section in a direction perpendicular to its center axis in a ring shape. The inner tube member 121 is arranged to cover and protect an inside surface of the side wall of the processing chamber 120 from plasma formed in a discharge chamber, that is a cylindrical space of the processing chamber 120 positioned inside its inner wall surface and above the upper surface of the sample stage 112.

A lower end portion of the inner tube member 121 is placed on a ground member 122 made of metal which constructs an inner wall of the processing chamber 120 and is attached to the vacuum vessel 110 so that it is held to a prescribed position in a height direction. The ground member 122 of the present embodiment is a member at least a part of an upper portion of which is positioned above the upper surface of the sample stage 112 in the height direction and arranged in a ring shape to surround an outer peripheral side of the sample stage 112.

In the present embodiment, an upper surface of an outer peripheral-side part of an upper end portion of the ground member 122 is recessed from that of an inner peripheral-side part to configures a recessed portion and the recessed portion is arranged to the outer peripheral side of the upper end portion of an entire periphery of a ring shape or of an approximating position that can be regarded as it is. Inside the recessed portion, a lower end portion is housed as the inner tube member 121 is installed in the vacuum vessel 110 to configure the inner wall of the processing chamber 120 while it is configured that the upper end portion of the ground member 122 covers the lower end portion of the inner tube member 121 from plasma.

Inside the sample stage 112, a substrate is arranged, which is a disk-like or cylindrical member made of metal, and is electrically connected with an RF bias power supply 114 through an automatic matching box 113. Over a disk-shaped upper surface of the substrate, a film (not illustrated) configured from a dielectric such as a ceramic like alumina or yttria is arranged to cover the upper surface, and the wafer 111 is placed on an upper surface of the dielectric film having a disk shape or an approximating shape that can be regarded as it is.

Below the window member 107 and toward the top of the processing chamber 120, a shower plate 108 made of a dielectric such as quartz is arranged, which is a disk-like member that constitutes a ceiling surface of the processing chamber 120 and has gas introduction holes arranged in a central portion thereof, that are a plurality of through holes through which a process gas for processing the wafer 111 is introduced to the inside of the processing chamber 120. A gap arranged between the shower plate 108 and the window member 107 disposed thereabove is connected with a supply path, that is a pipe line connected with a gas supply and through which the process gas is caused to flow, and a process gas supply system 109 arranged on the supply path and including a flow rate regulator that adjusts a flow rate and a speed of the process gas.

Above the window member 107 having a disk shape and above the processing chamber 120, a hollow portion 106 made of metal is arranged, which configures the plasma forming device and surrounds a space having a cylindrical shape or an approximating shape that can be regarded as it is with the circular upper surface of the window member 107 as a bottom surface. An outline of the hollow portion 106 also has a cylindrical shape and is connected at a central portion of an upper surface with a circular waveguide 105, which has a cylindrical shape with a circular section and a center axis extending in the vertical direction.

The center axis of the circular waveguide 105 is arranged to be concentric with a center of the cylindrical cavity (space) inside the hollow portion 106 or is arranged at an approximating position where the center axis can be regarded as it is. Therefore, the center axes of the circular waveguide 105 and the space inside the hollow portion 106 are positioned to be concentric, or positioned at an approximating position where it can be regarded as it is, with central axes of the cylindrically-shaped portion of the processing chamber 120 and the sample stage 112.

The circular waveguide 105 is connected at its upper end portion with one end portion of a square waveguide 103 a center axis of which extends in the horizontal direction and a section of which perpendicular to the center axis has a square or rectangular shape. The square waveguide 103 extends in the horizontal direction, at the other end of it a microwave source 101 is arranged, and an automatic matching box 102 is arranged in the middle of the one end portion of the square waveguide 103 and the microwave source 101.

Between the one end portion of the square waveguide 103 and the upper end portion of the circular waveguide 105, a square-circular waveguide converter 104 is arranged to connect them. The square-circular waveguide converter 104 also functions as a corner that bends the direction of the axes of the waveguides by 90 degrees, so that down-sizing of the plasma processing apparatus 100 is plotted.

The circular shape of the cross-section of the circular waveguide 105 of the present embodiment has a diameter that enables propagation of a TE11 mode only, which is the mode of the lowest order of the electric field of the microwave that propagates inside. Accordingly, other propagation modes are not mixed in the electric field in the circular waveguide 105 and, therefore, distribution of the intensity of the electric field of the microwave can be stabilized. Also, the circular waveguide 105 of the present embodiment includes a circularly polarized wave generator, a circularly polarized wave corrector, and a circularly polarized wave detector.

Above the hollow portion 106, and at an outer peripheral side of the circular waveguide 105 and an outer peripheral side of the side walls of the cylindrical portions of the hollow portion 106 and the vacuum vessel 110, a solenoid coil 119 arranged to surround an upper portion or side portions of the hollow portion and the processing chamber 120 is arranged. The solenoid coil 119 is configured with a multistage electromagnet and a magnetic material, and is supplied with direct-current power from a power supply (not illustrated) to generate a static magnetic field. The static magnetic field generated by the solenoid coil 119 is supplied to the processing chamber 120, and generates an interaction with the electric field of the microwave supplied to the processing chamber 120 in parallel to excite atoms and/or molecules of the process gas. Note that the microwave source 101, the automatic matching box 102, the square waveguide 103, the square-circular waveguide converter 104, the circular waveguide 105 and the devices such as the circularly polarized wave generator arranged in it, the hollow portion 106, and the solenoid coil 119 configure the plasma forming device.

The exhaust device connected with the exhaust port arranged below the sample stage 112 of the processing chamber 120 and at a bottom portion of the vacuum vessel 110 while penetrating therethrough includes the vacuum pump 117 such as a turbo-molecular pump. Furthermore, it includes a valve 115, which is arranged on an exhaust pipe line that connects the inlet of the vacuum pump 117 and the exhaust port, and opens/closes a flow path in a pipe line, and a pressure adjusting mechanism 116, which includes a plurality of plate-like flaps that rotate around axes that traverse the flow path in the pipe line below the valve 115 to increase/decrease a cross-sectional area of the flow path so that it adjusts a flow rate or a speed of exhaust from the processing chamber 120, thereby to adjust pressure in the processing chamber 120. Moreover, a pressure gauge (not illustrated) for measuring pressure in the processing chamber 120 is arranged to the vacuum vessel 110.

Note that, in the present embodiment, at a lower side wall of the cylindrical portion that configures the upper portion of the vacuum vessel 110 it is connected with a vacuum transfer vessel, which is another vacuum vessel (not illustrated) and in a depressurized chamber inside of which the wafer 111 is transferred while being placed on a tip of a robot arm (not illustrated) between the internal transfer chamber of the vacuum transfer vessel and the processing chamber 120, a gate which communicates them to configure a passage through which the wafer 111 is transferred is provided. Inside the vacuum transfer chamber, or between the vacuum vessel 110 and the vacuum transfer vessel, a gate valve that releases and/or blocks air-tightly the gate is arranged.

While the gate valve (not illustrated) is released, the robot arm (not illustrated) extends so that a wafer 111 before processing placed on a upper surface of a hand at the tip thereof is transferred into the processing chamber 120, and is delivered to the sample stage 112 above the sample stage 112.

The wafer 111 is placed on tips of a plurality of pins (not illustrated) on the way the plurality of pins, which are accommodated in the sample stage 112 and movable in the vertical direction, move above the upper surface of the sample stage 112 so that it is raised further above the upper surface of the arm of the robot arm. After then, when the robot arm contracts to move away from above the sample stage 112, the plurality of pins move downward and are stored in the sample stage 112 and the wafer 111 is placed on the upper surface of the sample stage 112. When the robot arm exits out from within the processing chamber 120, the gate valve is blocked and the inside of the processing chamber 120 is sealed.

After the wafer 111 is placed above the upper surface of the dielectric film that configures the upper surface of the sample stage 112, while it is electrostatically adsorbed by the dielectric film by electrostatic force formed by supplying DC power supplied to a film-like electrode (not illustrated) arranged in the dielectric film and is held on the dielectric film, the process gas supplied from a process gas supply system through the gas introduction holes in the shower plate 108 is introduced from the above into the inside of the processing chamber 120 while the flow rate and the speed are adjusted by the flow rate regulator. In addition, the gas or particles inside the processing chamber 120 are discharged through the exhaust port arranged in the bottom surface of the processing chamber 120 by an operation of the vacuum pump 117, in parallel to the introduction of the process gas.

By a balance of the flow rates and the speeds between the introduction of the process gas from the gas introduction holes and the exhaust from the exhaust port, the pressure inside the processing chamber 120 is adjusted to a value within a range suitable for the processing. The flow rate and the speed of the exhaust are adjusted by increase/decrease of a cross-sectional area of the flow path of the exhaust pipe line by a change of an angle of rotation of the flaps around the axes in the pressure regulating mechanism that configures the exhaust device.

The electric field of a microwave oscillated and formed by the microwave source 101 such as a magnetron propagates toward the one end portion side in the square waveguide 103 and reaches the square-circular waveguide converter 104. The electric field of the microwave generated by the microwave source 101 and transmitted through the square waveguide 103 in the horizontal direction (from the right to the left on the drawing) is transmitted into the circular waveguide 105 as its direction of propagation is changed to downward at the square-circular waveguide converter 104.

The electric field propagating downward inside the circular waveguide 105 along its axial direction is introduced to the inside of the cylindrical cavity inside the hollow portion 106 connected to the lower end portion of the circular waveguide 105, and a specific mode and distribution of the electric field are formed in the cavity by, for example, resonance of the electric field. The hollow portion 106 of the present embodiment has a role to adjust the distribution of the electric field to a distribution suitable for plasma processing.

The electric field of the microwave adapted in a specific distribution inside the hollow portion 106 transmits the window member 107 that configures the bottom surface of the cavity and the shower plate 108 therebelow to be introduced into the processing chamber 120. Furthermore, the interaction of the static magnetic field supplied from the solenoid coil 119 and the electric field of the microwave exerts Lorentz force on electrons which are in motion in the static magnetic field to generate cyclotron motion. By causing a frequency of the electric field of the microwave and a frequency of the cyclotron motion to accord with each other, electron cyclotron resonance (ECR) is generated, in which the power of the microwave is absorbed in the electrons in a resonant manner, to excite the process gas and plasma is formed in the processing chamber 120 above the sample stage 112.

Since the shower plate 108 that configures the ceiling surface of the processing chamber 120 is directly exposed to the plasma and directly receives an action from it, it is desirable to be configured with a material having high plasma resistance and not having an adverse impact on the plasma processing. Also, as for the material of the window member 107 and the shower plate 108, since a material that efficiently transmits the electric field of the microwave is desirable, quartz is used as the material of them in the present embodiment.

Once the plasma is formed in the processing chamber 120, radio-frequency power from the RF bias power supply 114 is supplied to the substrate, which is an electrode in the sample stage 112, through the automatic matching box 113 to form a bias potential above the upper surface of the wafer 111 adsorbed and held on the dielectric film thereabove, so that processing of the wafer 111 is started. Charged particles in the plasma are attracted in a direction toward the upper surface of the wafer 111 in response to a difference between the bias potential and the potential of the plasma and collide with a surface of a film structure having a plurality of film layers formed on the upper surface of the wafer 111 in advance, resulting progress of anisotropic processing in the direction of the potential of the film to be processed described above.

When an end point of the processing is detected by a determination unit (not illustrated), the supply of the radio-frequency power from the RF bias power supply 114 to the sample stage 112 is stopped to stop the processing and the plasma is extinguished. After then, the supply of the process gas is stopped and an inert gas is supplied into the processing chamber 120 instead. Furthermore, the electrostatic chuck of the wafer 111 is removed and the wafer 111 is lifted up above the sample stage 112; when the wafer 111 is delivered to the robot arm, which has proceeded in the processing chamber 120 similarly to before the start of the processing, the wafer 111 is transferred outside the processing chamber 120 by exit of the arm.

In the present embodiment, as the frequency of the power output by the RF bias power supply, one with 400 kHz is used. Also, as the wafer 111, one having a diameter of 450 mm is used.

Moreover, in the present embodiment, by using a magnetic material for the solenoid coil 119, leakage of an unnecessary magnetic field to an outside is prevented and magnetic field lines can be concentrated to the processing chamber 120 that is surrounded by the solenoid coil 119 arranged in a ring shape or in a cylindrical shape, thereby enabling to supply the magnetic field to the processing chamber 120 efficiently. Furthermore, by using a multistage electromagnet for the solenoid coil 119 and regulating DC currents flowing in the respective electromagnets, the distribution of the static magnetic field in the processing chamber 120 is adjusted to be desired. Particularly, the static magnetic field of the present embodiment is adjusted to have its isomagnetic surfaces to be uniform in the angular direction around the center axis and to have a shape parallel to the axial direction, so that the non-uniformity around the center axis of the processing chamber 120 can be decreased.

When the frequency of the electric field of the microwave formed by the microwave source 101 is 2.45 GHz, the ECR can be generated as the solenoid coil 119 forms a static magnetic field of 0.0875 tesla. With such ECR, there is an effect to easily generate plasma even in low pressure in which the plasma is difficult to be generated in other general conditions.

Also, since the atoms and molecules of the gas are locally excited at the locations and their vicinities to create plasma where the ECR distributed in a plane is generated in the space above the sample stage 112 of the processing chamber 120 by the magnetic field supplied as described above, a region where the plasma is generated can be controlled by adjustment of the static magnetic field. Furthermore, since the motions of the electrons are restricted by the magnetic field, diffusion of the plasma in a direction perpendicular to the magnetic field is suppressed, and the distribution of the plasma can be desirably controlled by adjusting the strength of the magnetic field and the distribution of the position in the processing chamber 120.

The plasma processing apparatus 100 of the present embodiment includes the circularly polarized wave generator, the circularly polarized wave corrector, and the circularly polarized wave detector in the circular waveguide 105. A configuration of the circularly polarized wave corrector of the present embodiment is described using FIGS. 2 and 3.

Figure 2:
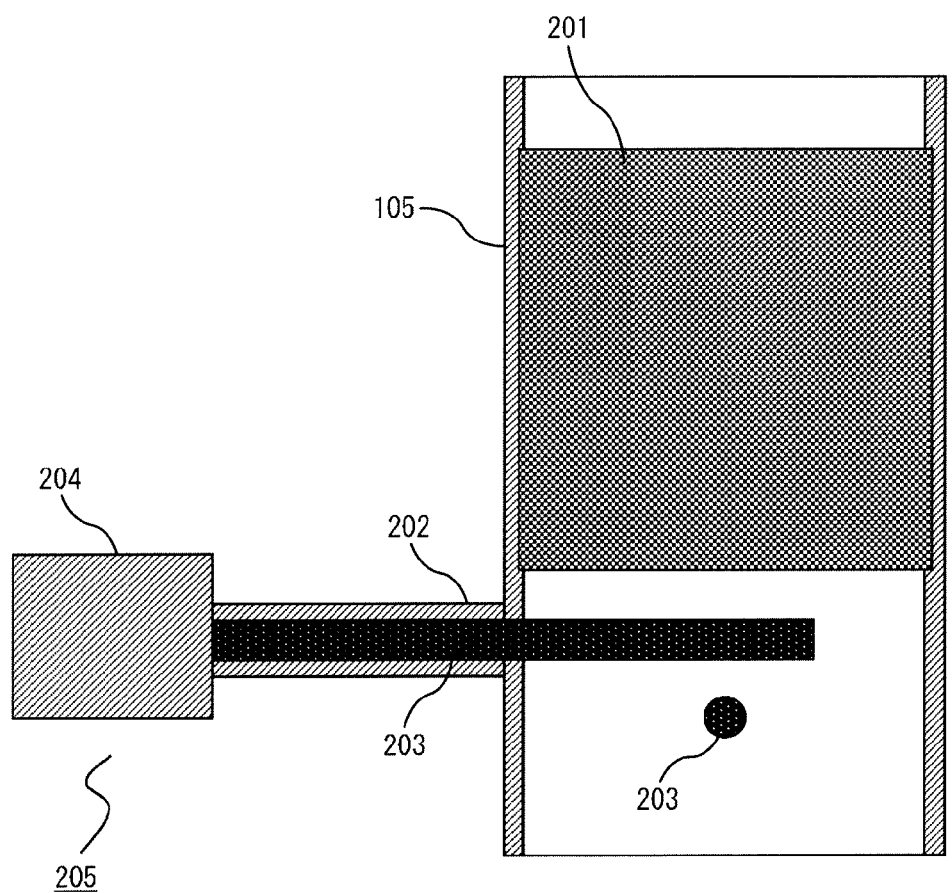
FIG. 2 is a longitudinal sectional view schematically illustrating a configuration along a center axis of a circular waveguide of the embodiment illustrated in FIG. 1.
Figure 3:
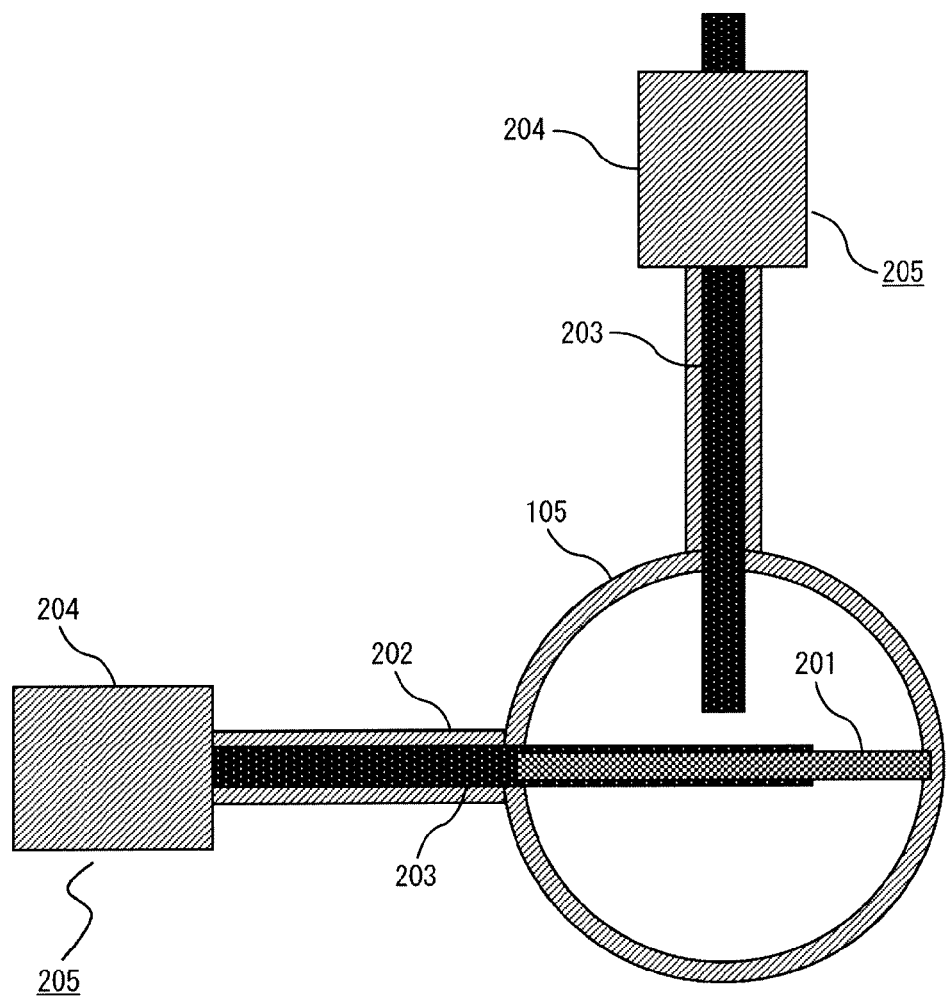
FIG. 3 is a transverse sectional view schematically illustrating a configuration of the circular waveguide as viewed from above along a direction of the center axis of the circular waveguide of the embodiment illustrated in FIG. 1.

FIG. 2 is a longitudinal sectional view schematically illustrating a configuration along the center axis of the circular waveguide 105 of the embodiment illustrated in FIG. 1, and FIG. 3 is a transverse sectional view schematically illustrating a configuration of the circular waveguide 105 as viewed from above along the direction of the center axis of the circular waveguide 105 of the embodiment illustrated in FIG. 1. FIG. 3 shows the view from above the circularly polarized wave generator 201.

As illustrated in these figures, a circularly polarized wave generator 201 and circularly polarized wave correctors 205 are arranged in the cylindrical portion of the circular waveguide 105 of the present embodiment in such a way that their parts, especially end portions thereof protrude into the inside of the cylinder of the circular waveguide 105 that is the propagation path of the electric field, or traverse the axis of the cylinder or the direction of propagation of the electric field. The circularly polarized wave corrector 205 of the present embodiment is configured to include a dielectric stub 203 of a columnar shape, a tube 202 made of a conductor, and a driving device 204 of the dielectric stub 203.

The circularly polarized wave correctors 205 are installed at different phases with respect to the center axis of the circular waveguide 105, that is, at positions of different angles around the axis of the circular waveguide 105 in a manner that the axial directions of the columnar or rod-like dielectric stubs 203 are radially arranged from the center axis, as viewed from above or below of the axis of the circular waveguide 105. In the present embodiment, two circularly polarized wave correctors 205 are installed to the cylinder of the circular waveguide 105 at different heights with respect to the vertical direction along the axis of the cylinder such that the axes of the dielectric stubs 203 are perpendicular to each other.

The columnar or rod-like dielectric sub 203 can increase/decrease the length of the portion protruding into the cylinder of the circular waveguide 105 by the driving device 204 including an actuator. As the dielectric stub 203, it is desirable to use a dielectric having a small loss against the microwave, and high-purity alumina ceramic is used in the present embodiment.

As for means to generate a circularly polarized wave inside a waveguide, various kinds have been known hitherto, and these can also be used in the present embodiment. Particularly, the plasma processing apparatus of FIG. 1 uses the circularly polarized wave generator 201 in which a flat plate member made of a dielectric is arrange with its surface parallel to the axial direction of the circular waveguide 105. As the material of the flat plate member of the circularly polarized wave generator 201, it is desirable to use a dielectric having a small loss against the microwave, and quartz is used in the present embodiment.

As illustrated in FIG. 3, in the present embodiment, the dielectric stub 203 of one circularly polarized wave corrector 205 is arranged such that the axis thereof is parallel to the surface of the flat plate member of the circularly polarized wave generator 201, and the dielectric stub 203 of the other circularly polarized wave corrector 205 is arranged such that the axis thereof is perpendicular to the surface. Note that, in the present embodiment, the plurality of circularly polarized wave correctors 205 are installed at different height positions in the axial direction so that the portions of the respective dielectric stubs 203 protruding in the cylinder of the circular waveguide 105 do not interfere with each other by contacting with each other or impeding each other's operations; however, it is not limited thereto, and the dielectric stubs 203 may be installed at the same height positions.

As described above, in the circularly polarized wave corrector 205 its dielectric stub 203 is coaxially inserted to an inside of the tube 202 made of a conductor, which connects the driving device 204 and the cylinder made of metal of the circular waveguide 105, and one end portion of it is connected with the driving device 204 so that it moves inside along the direction of the axis of the dielectric stub 203 or the axis of the tube 202 by an operation of the driving device 204 to relatively change the position with respect to the tube 202. Also, it is arranged so that the other end portion of the dielectric stub 203 penetrates a hole arranged in the cylinder member of the circular waveguide 105 to protrude in the inside of the cylinder. With the configuration, the portion protruding in the cylinder of the circular waveguide 105 including a tip of the other end side moves inside the cylinder in the axial direction perpendicular to the axis thereof along with the movement of the dielectric stub 203 in the tube 202 so that the dielectric stub 203 can change the length of the portion protruding into the cylinder of the circular waveguide 105.

Note that, although the tube 202 made of a conductor can be operated as a circular waveguide, the microwave of the frequency of 2.45 GHz used in the present embodiment is cut off as follows and cannot propagate inside the tube 202. Therefore, by making the length of the tube 202 made of a conductor to be a prescribed value or more, leakage of the electric field of the microwave through the tube 202 is suppressed. In the present embodiment, the length of the tube 202 made of a conductor is set to 50 mm.

For example, in a circular waveguide of a diameter of 10 mm, into which a dielectric having relative permittivity of 9.7 is inserted and made dense, a cutoff frequency of the TE11 mode becomes 5.64 GHz, and an attenuation of the electric field becomes $3.32 \times 10^2$ nep/m. Therefore, in the case where the length of the circular waveguide is 50 mm, the electric field attenuates to $6.28 \times 10^{-6}$%. From this, it has been judged that the electric field of the microwave propagating inside the tube 202 of the present embodiment does not substantially exist or can be regarded to be negligibly small.

When a member made of a conductor is used as a stub to be inserted in the inside of such the circular waveguide 105, if electrical connection between the tube 202 made of a conductor and the stub made of a conductor is insufficient, these may operate as a coaxial line. In the coaxial line, propagation of an electric field cannot be sufficiently cut off like one made of a dielectric material, and there is greater possibility that the electric field of the microwave propagates through the tube 202 and the electric field leaks.

In order to suppress this, it is necessary to secure the electrical connection between the tube 202 and the stub made of a conductor sufficiently. Meanwhile, when a stub made of a dielectric is used, by making the length of the tube 202 to be a prescribed value or more with which a sufficient attenuation of the strength of the electric field can be obtained the leakage of the electric field of the microwave can be suppressed and there is an advantage of simplification of the structure.

Figure 4:
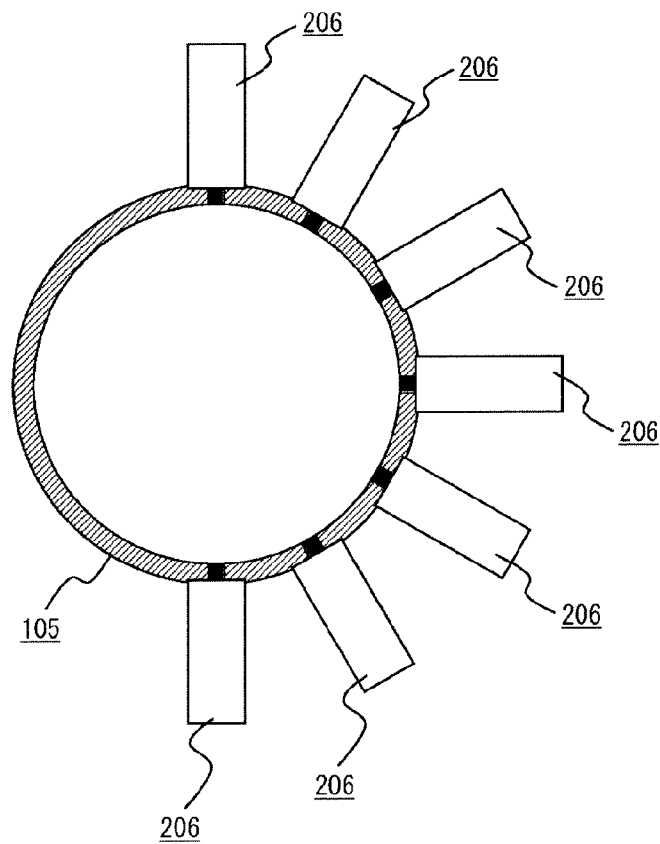
FIG. 4 is a transverse sectional view schematically illustrating an outline of a configuration of circularly polarized wave detectors 206 arranged in a circular waveguide 105 of a plasma processing apparatus 100 according to the embodiment illustrated in FIG. 1.

Using FIG. 4, a circularly polarized wave detector 206 arranged in the circular waveguide 105 of the present embodiment is described. FIG. 4 is a transverse sectional view schematically illustrating an outline of a configuration of the circularly polarized wave detectors 206 arranged in the circular waveguide 105 of the plasma processing apparatus 100 according to the embodiment illustrated in FIG. 1. This figure is a diagram as viewed at a position below the dielectric stub 203 from above the circularly polarized wave detector 206 in a direction of the circular waveguide 105.

In an outside surrounding of the cylindrical portion of the circular waveguide 105 of the present embodiment, a plurality of circularly polarized wave detectors 206 including an electric field detector are provided, which are arranged equally in a circumferential direction of the cylinder or at angular positions of approximating values that can be regarded as it is. Each of the electric field detectors is a cylindrical member or a tubular member having a polygonal section and its tip is inserted into a hole arranged to penetrate the cylinder in a plane on the processing-chamber 120 side of the dielectric stub 203 that is the circularly polarized wave corrector and perpendicular to the center axis of the circular waveguide 105 to be disposed to face the electric field inside. The circularly polarized wave detectors 206 and the processing chamber 120 are connected by the circular waveguide 105 and the hollow portion 106, which form a propagation path arranged between them.

From an output detected in each of the electric field detectors arranged as described above, electric field strength at each position in the plane, where these are arranged, perpendicular to the axis of the circular waveguide 105 is detected and the degree of the circularly polarized wave is quantified from the results. Although FIG. 4 illustrates an example in which seven electric field detectors are provided in a range of 180 degrees around the axis of the circular waveguide 105 at 30-degree intervals, it is necessary to arrange three or more electric field detectors at different positions in the circumferential direction in the above-described plane in order to perform detection of the electric field strength and quantification of the circularly polarized wave and the present invention is not limited to the number and the positions of the arrangement of the present embodiment.

The processing chamber 120 of the present embodiment has the cylindrical portion in its upper part, which is connected with the hollow portion 106 across the shower plate 108 and the window member 107, and the cylindrical portion is arranged so that its axis coincides with the center axis of the cylinder of the circular waveguide 105, or at an approximating position which can be regarded as it is. The electric field strength of the circularly polarized wave, which has been formed in the upper portion of the circular waveguide 105 and corrected in the circularly polarized wave generator 201 and the circularly polarized wave corrector 205 below, is detected by the circularly polarized wave detectors 206 and the axial ratio of the circularly polarized wave is detected using the outputs.

Using the detection result, the operations of the circularly polarized wave correctors 205 are adjusted by a control unit (not illustrated) and a circularly polarized wave with adjusted distribution of the electric field transmits the shower plate 108 and the window member 107, and is introduced into the processing chamber 120. Causes of deterioration of the axial ratio of the circularly polarized wave introduced into the cylindrical portion of the processing chamber 120 are suppressed to the minimum.

Figure 5:
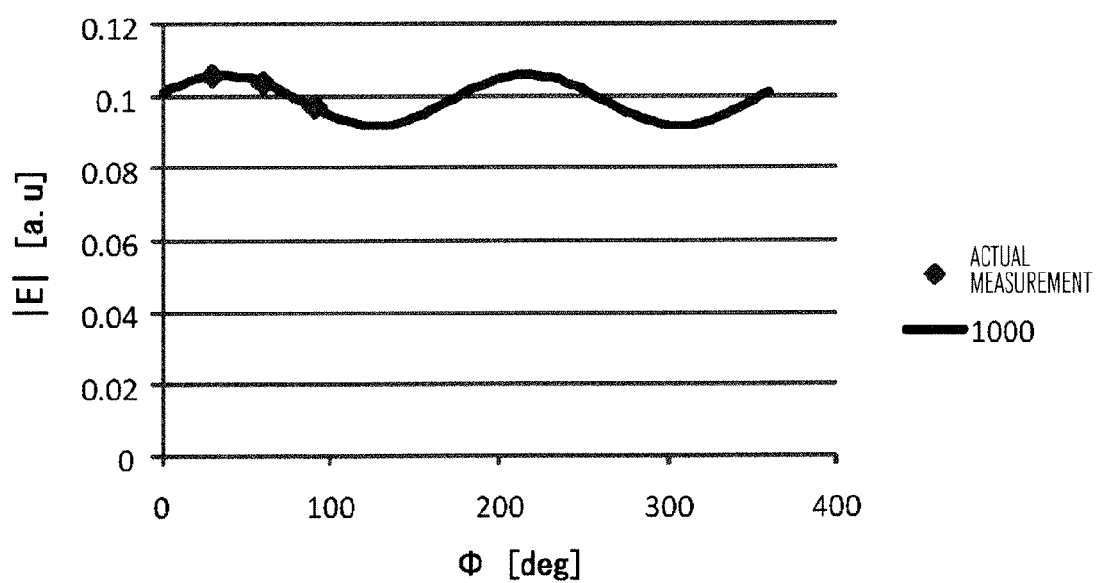
FIG. 5 is a graph illustrating an example of distribution of a parameter of an electric field around a center axis inside a processing chamber of a prior art.
Figure 6:
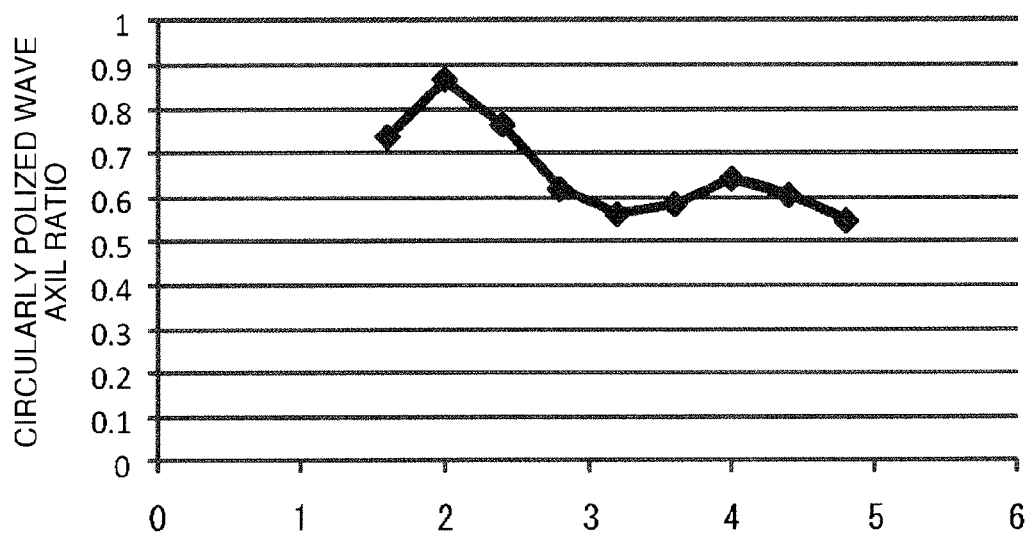
FIG. 6 is a graph illustrating a change of an axial ratio of a circularly polarized wave of an electric field, formed by power when the magnitude of the power that forms the electric field for plasma formation in a prior art.

Using FIGS. 5 and 6, functions and effects of the configuration to correct the circularly polarized wave of the present invention is now described. First, FIG. 5 illustrates distribution of values of a parameter that indicates a characteristic of an electric field in a prior art of a plasma processing apparatus, where only a circularly polarized wave generator with a fixed characteristic is used without using the circularly polarized wave corrector.

FIG. 5 is a graph illustrating an example of distribution of a parameter of an electric field around a center axis inside a processing chamber of a prior art to the present invention. Particularly, the mounting position of the circularly polarized wave generator with a fixed characteristic is optimized, and the axial ratio of the circularly polarized wave is detected.

In the present example, outputs from three electric field detectors, out of the electric field detectors of circularly polarized wave detectors 206, corresponding to positions of $\Phi=30°$, $60°$, and $90°$ from a reference angle position arbitrarily determined around an axis are used. In the figure, actual measurement values of the respective electric field detectors are shown with black diamonds, and results of estimation of the electric field at arbitrary positions by the solid line.

In the example of the prior art, the electric field strength of the circularly polarized wave is not optimized to one with a constant in the circumferential direction, and the axial ratio of the circularly polarized wave was 0.87. Note that a circularly polarized wave with the axial ratio=1 indicates a perfect circularly polarized wave, and one with the axial ratio=0 indicates a linearly polarized wave.

Next, power of the electric field of the microwave is changed from a condition in which generate plasma is generated in FIG. 5, and the axial ratio of the circularly polarized wave is detected, so that a correlation between the axial ratio of the circularly polarized wave and the power of the microwave is detected. FIG. 6 illustrates the result. FIG.

6 is a graph illustrating a change of the axial ratio of the circularly polarized wave of the electric field formed by power when the magnitude of the power that forms the electric field for plasma formation is changed in the prior art.

As illustrated in this figure, a change of the power that forms the electric field resulted in deterioration of the axial ratio of the circularly polarized wave from the axial ratio=0.87 in the example illustrated in FIG. 5. From this, it has been judged that a circularly polarized wave generator with a fixed characteristic is insufficient to maintain a high axial ratio of the circularly polarized wave corresponding to an arbitrary condition for generating plasma, and adjustment of the characteristic is necessary. However, in the example of this prior art, the axial ratio is a value of 0.5 or more even when it is most deteriorated, and generation of some extent of circularly polarized wave has been confirmed. Also from the result detected in the example of FIG. 6, it has been found that up to around 1.0 from 0.5 is sufficient with regard to the width of adjustment of the characteristic of the circularly polarized wave.

Figure 7A:
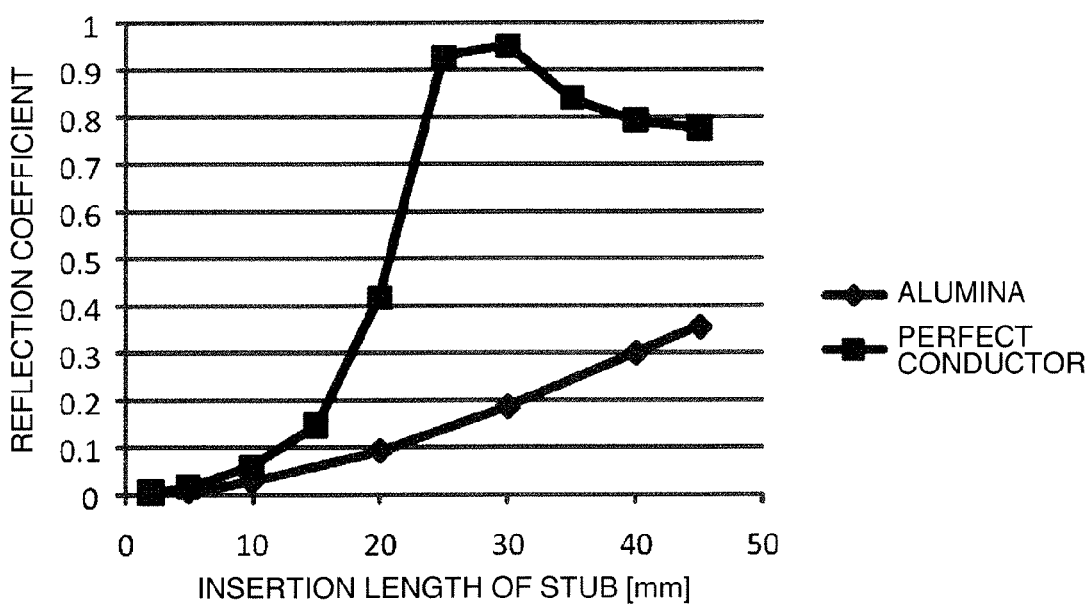
FIG. 7A is a graph illustrating changes of a reflection coefficient of electric power in a circular waveguide with respect to a change of a length protruding into an inside when a stub is inserted perpendicular to the center axis of a cylinder of the circular waveguide.
Figure 7B:
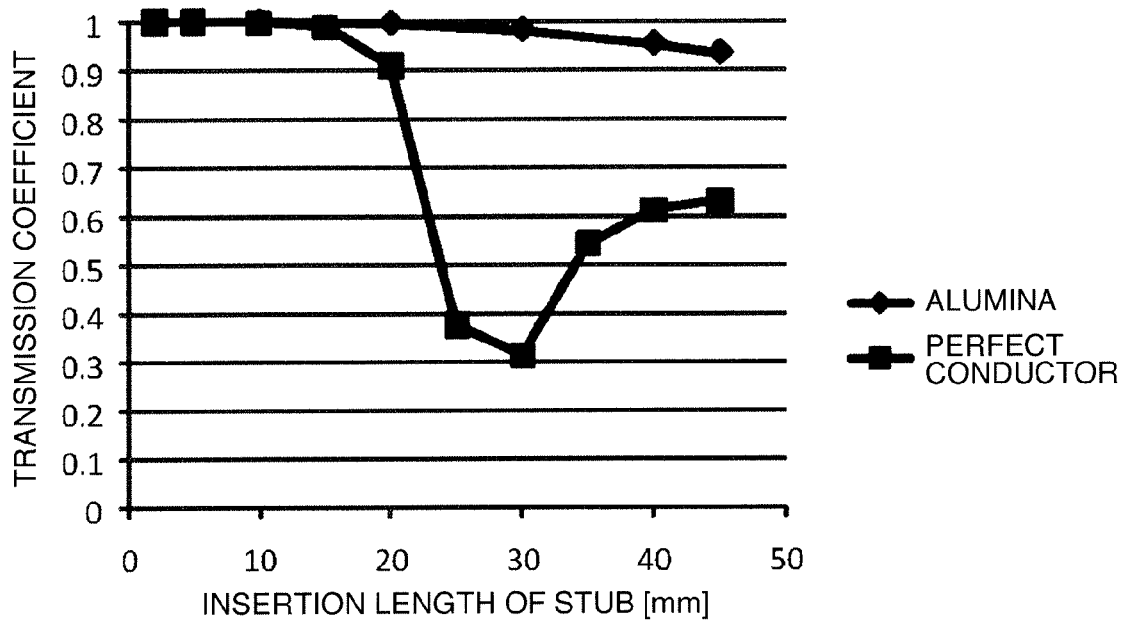
FIG. 7B is a graph illustrating changes of a transmission coefficient of electric power in a circular waveguide with respect to a change of a length protruding into an inside when a stub is inserted perpendicular to the center axis of a cylinder of the circular waveguide.

Next, results of comparison and examination of a dielectric and a conductor as the stub of the circularly polarized wave corrector 205 are illustrated in FIGS. 7A and 7B. FIGS. 7A and 7B are graphs illustrating changes of a reflection coefficient and a transmission coefficient of the electric field inside the circular waveguide 105 with respect to a change of a length protruding to an inside when a column having a diameter of 10 mm as for the stub is inserted perpendicular to the center axis of the cylinder of the circular waveguide 105.

In this example, results of comparison between a perfect conductor and an alumina ceramic (the relative permittivity is 9.7) regarding the material of the column are illustrated. Note that the electric field of the microwave is assumed to be parallel to the insertion direction of the column on the center axis of the circular waveguide 105. Furthermore, detection of the electric field is performed by solving Maxwell's equation with a finite element method.

Comparing the respective changes with the alumina ceramic and the perfect conductor illustrated in FIGS. 7A and 7B, it has been found that the changes of the transmittance and the reflectance with respect to the amount of insertion in the case of the perfect conductor are larger and more complicated than those in the case of the alumina ceramic. For example, in the case of the alumina ceramic (described as alumina in FIGS. 7A and 7B), it is shown that the change is monotonous in the range of the calculation, and a change amount is relatively small. From the results of FIGS. 7A and 7B, the inventors have decided to examine a configuration using the alumina ceramic that yields a monotonous and gentle change in the present invention, because control becomes difficult if the characteristics change in a complicated or sharp manner with respect to the insertion length.

It is known that the electric field or the magnetic field cannot typically penetrate into a substance of high conductivity such as metal, and is reflected on a surface. On the other hand, in a dielectric, it is known that a part of the electric field can penetrate into the inside although the degree of reflection varies depending on a difference in relative permittivity between an ambient medium and itself. The inventors have considered that the result exhibiting gentle characteristics and no sharp change has been obtained when a dielectric is used as a material of the stub in FIGS. 7A and 7B.

Moreover, a result of detection of the axial ratio of the circularly polarized wave in the circular waveguide 105 is shown when the circularly polarized wave corrector 205 of the present embodiment illustrated in FIG. 2 is used. In this example, a calculation model with a finite element method is created and scattering matrixes are calculated by solving Maxwell's equation about the square-circular waveguide converter 104 of the embodiment illustrated in FIG. 1 and the circularly polarized wave correctors 205 including the circularly polarized wave generator 201 with a fixed characteristic and the dielectric stubs 203.

In addition, a reflection coefficient of plasma as a load is assumed and the overall scattering matrix is calculated by compositing the respective scattering matrixes. The axial ratio and the reflection coefficient of the circularly polarized wave are obtained from the obtained overall scattering matrix.

Figure 8:
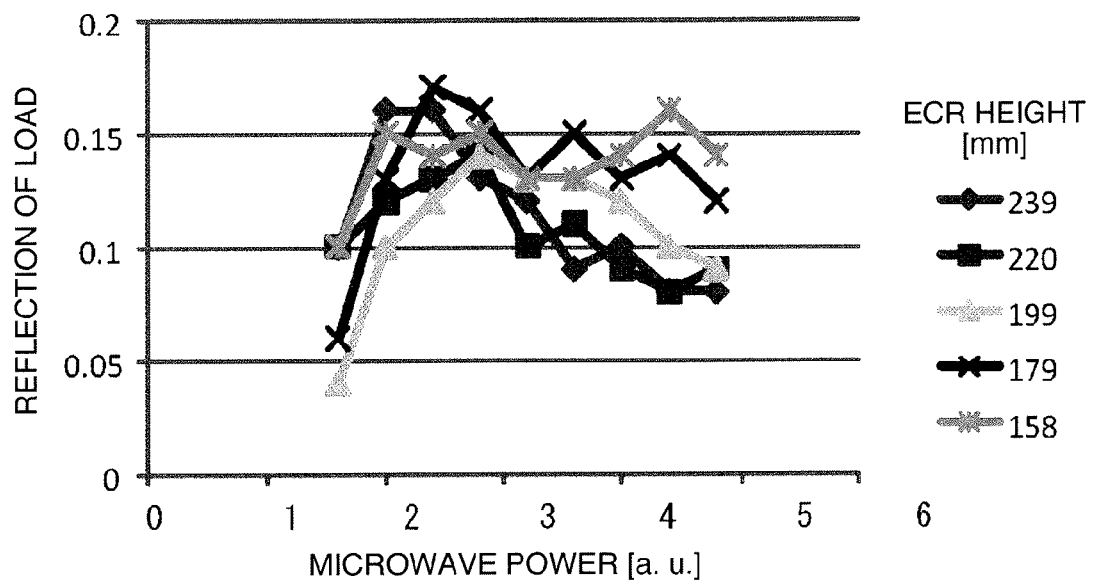
FIG. 8 is a graph illustrating a change of the magnitude of a reflection coefficient $\Gamma_{1d}$ of a plasma load with respect to a change of a processing condition of the plasma processing apparatus according to the embodiment illustrated in FIG. 1.

First, a reflection coefficient of power from the plasma as a load is detected when the magnitudes of the power that provides the electric field for forming plasma and the static magnetic field are changed. FIG. 8 is a graph illustrating a change of the magnitude of a reflection coefficient $\Gamma_{1d}$ of a plasma load with respect to a change of a processing condition of the plasma processing apparatus according to the embodiment illustrated in FIG. 1. It illustrates values of changes when the power of the microwave and the static magnetic field are changed.

As illustrated in the figure, by changing the power of the microwave and the static magnetic field, the reflection coefficient $\Gamma_{1d}$ of a plasma load is changed, but the magnitude never exceeds 0.2. It has been found that, although a pressure value in the processing chamber 120 or gas species used are changed and the reflection coefficient $\Gamma_{1d}$ of a plasma load is calculated similarly, the magnitude never exceeds 0.2 and the width of variation is at most around 0.2.

As described above, it has been found that the reflection coefficient $\Gamma_{1d}$ of the plasma load falls within the range of about 0 to 0.2 with respect to the variation of the processing condition. Therefore, next, the characteristics of the circularly polarized wave corrector 205 in this range are detected.

First, changes of the axial ratio and the reflection coefficient with respect to changes of the protrusion (insertion) lengths of the dielectric stubs 203 of the circularly polarized wave correctors 205 are detected when the reflection coefficient of the plasma load is 0 (no reflection). In this example, the change of the axial ratio of the circularly polarized wave and the change of the reflection coefficient are illustrated in FIGS. 9A and 9B when the insertion lengths of two dielectric stubs 203 are independently changed within a range of 2 to 45 mm.

Figure 9A:
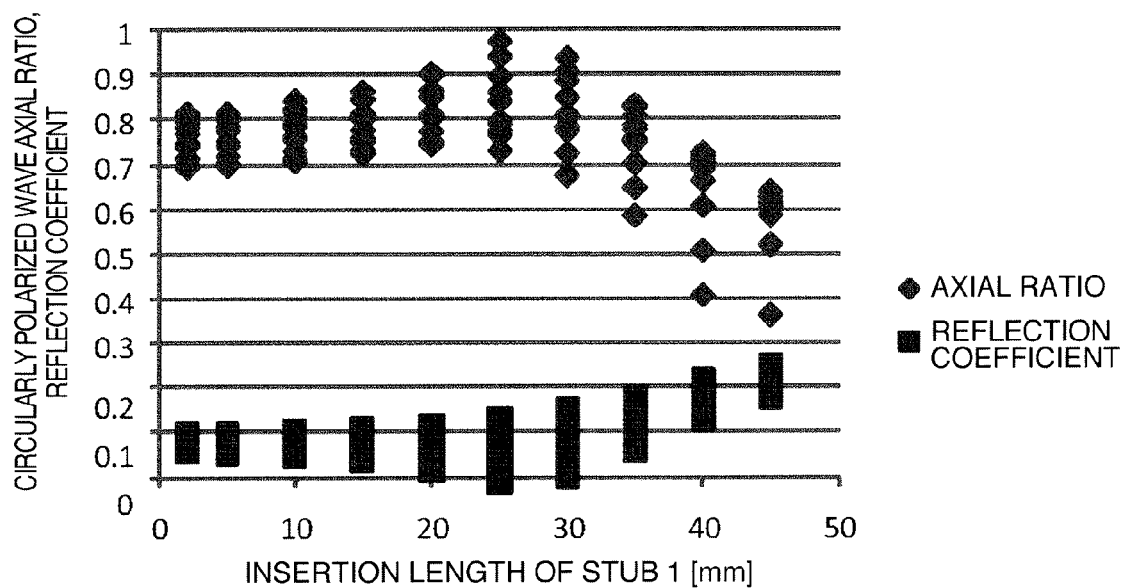
FIGS. 9A and 9B are graphs illustrating changes of an axial ratio of a circularly polarized wave and the reflection coefficient of plasma with respect to changes of insertion lengths of dielectric stubs in the plasma processing apparatus of the embodiment illustrated in FIG. 1 when the reflection coefficient of plasma is 0.
Figure 9B:
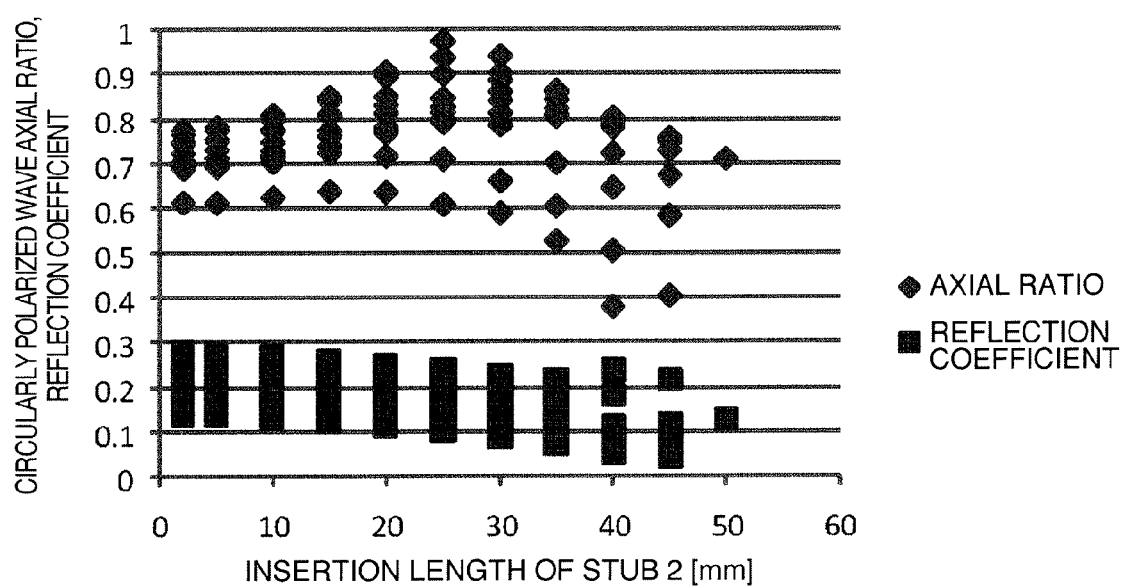

FIGS. 9A and 9B are graphs illustrating the changes of the axial ratio of the circularly polarized wave and the reflection coefficient of the plasma with respect to the changes of the insertion lengths of the dielectric stubs 203 in the plasma processing apparatus of the embodiment illustrated in FIG. 1 when the reflection coefficient of plasma is 0. FIG. 9A illustrates a case in which the insertion length of the dielectric stub (stub 1) is 25 mm, and FIG. 9B illustrates a case in which the insertion length of the other dielectric stub (stub 2) is 25 mm.

It has been found that the axial ratio of the circularly polarized wave can be adjusted to the maximum value of 0.97 and a value of the axial ratio sufficiently approximating the perfect circularly polarized wave can be obtained when the insertion length of one dielectric stub (stub 1) is 25 mm and the insertion length of the other dielectric stub (stub 2) is 25 mm. Further, it has been found that the reflection coefficient of this time is 0.2 or less at a maximum, which is not so large.

Next, calculation was performed for the case where the magnitude of the reflection coefficient $\Gamma_{ld}$ of the plasma load was 0.2. The calculation was similarly performed by creating a calculation model by compositing the scattering matrixes and the axial ratio of the circularly polarized wave and the reflection coefficient were evaluated.

Since the reflection coefficient of the load $\Gamma_{ld}$ is a complex number, which has a magnitude and a phase, taking the abscissa to represent the phase, comparison of a case where the dielectric stubs are not inserted (described as "without stub adjustment") and a case where the dielectric stubs are adjusted to obtain the maximum axial ratio (described as "with stub adjustment") is performed. Results are illustrated in FIGS. 10A and 10B.

Figure 10A:
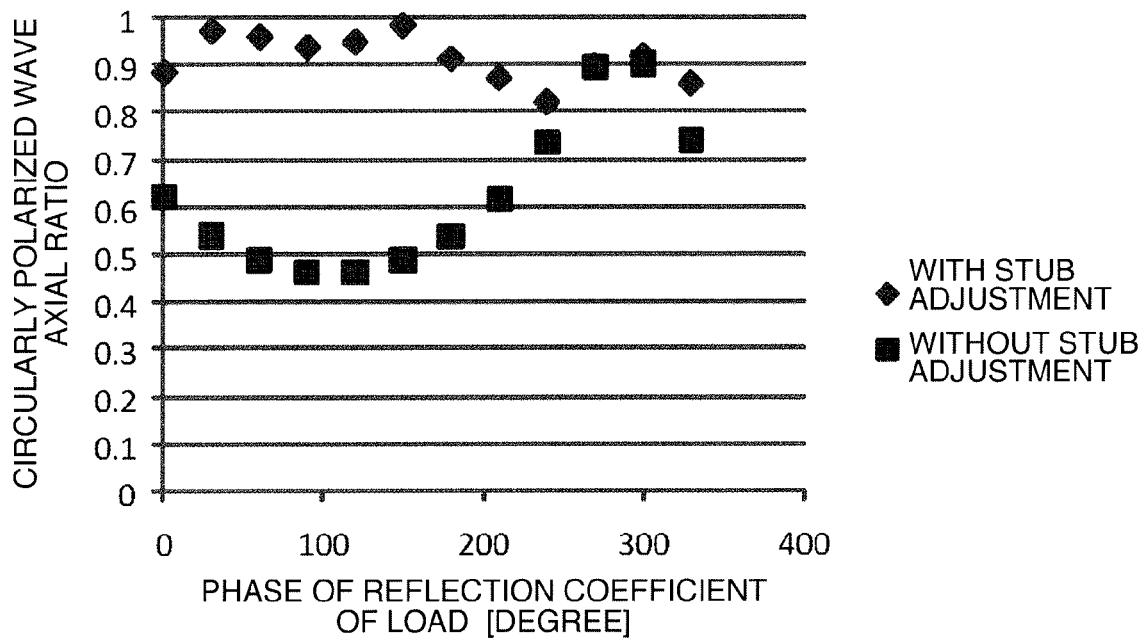
FIG. 10A is a graph illustrating a change of an axial ratio of a circularly polarized wave with respect to a change of a phase of a reflection coefficient of a load with an insertion length of a dielectric stub as a parameter in the plasma processing apparatus of the embodiment illustrated in FIG. 1 when the reflection coefficient of plasma is 0.2.
Figure 10B:
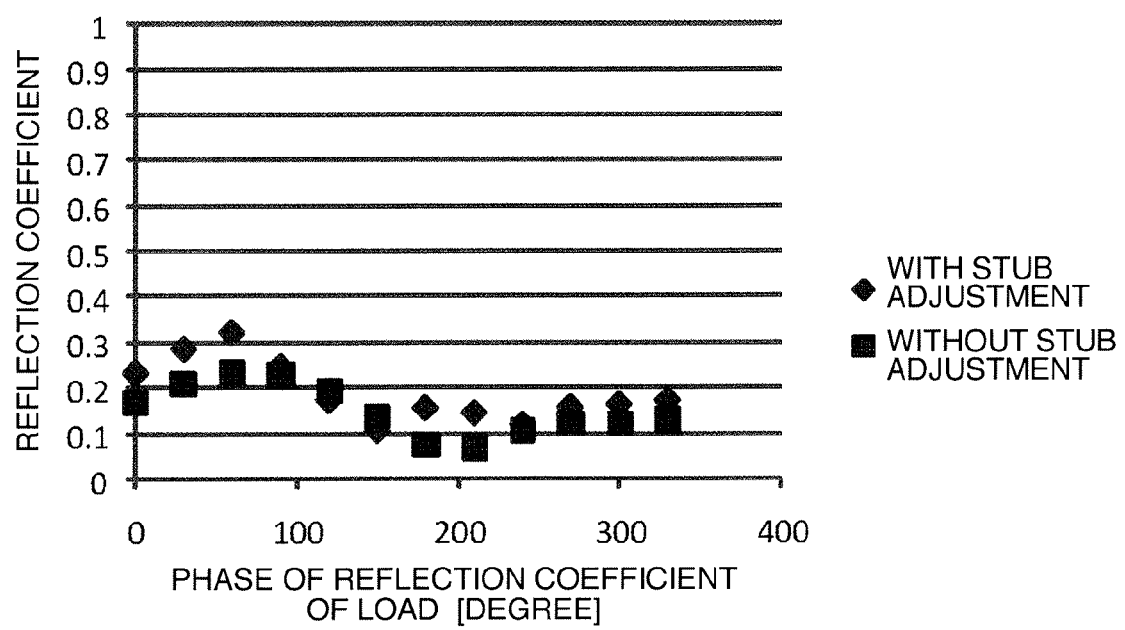
FIG. 10B is a graph illustrating a change of the reflection coefficient with respect to a change of a phase of a reflection coefficient of a load with an insertion length of a dielectric stub as a parameter in the plasma processing apparatus of the embodiment illustrated in FIG. 1 when the reflection coefficient of plasma is 0.2.

FIGS. 10A and 10B are graphs illustrating the changes of the axial ratio of the circularly polarized wave and the changes of the reflection coefficient with respect to the change of the phase of the reflection coefficient of the load with the insertion length of the dielectric stub 203 as a parameter in the plasma processing apparatus of the embodiment illustrated in FIG. 1 when the reflection coefficient of the plasma is 0.2. FIG. 10A illustrates the change of the axial ratio of the circularly polarized wave and FIG. 10B illustrates the change of the reflection coefficient.

It has been found out that the axial ratio of the circularly polarized wave can be adjusted to roughly about 0.9 in all ranges of the phase of the reflection coefficient in the case of "with stub adjustment" as illustrated in these figures. Also, it has been found that the reflection coefficient is about 0.3 at most, which is not so large, and there is no practical issue.

As described above, it has been found that, corresponding to a change of the process condition, the axial ratio of the circularly polarized wave can be adjusted to as high as roughly about 0.9 by adjusting the insertion amount of the dielectric stub, in the cases where the magnitude of the reflection coefficient of plasma is 0 and 0.2. Even when there is a reflection wave from the plasma load side in this way, the axial ratio of the circularly polarized wave can be optimally adjusted and, therefore, high uniformity can be maintained even in the case of a change of the process condition or the like.

Figure 11:
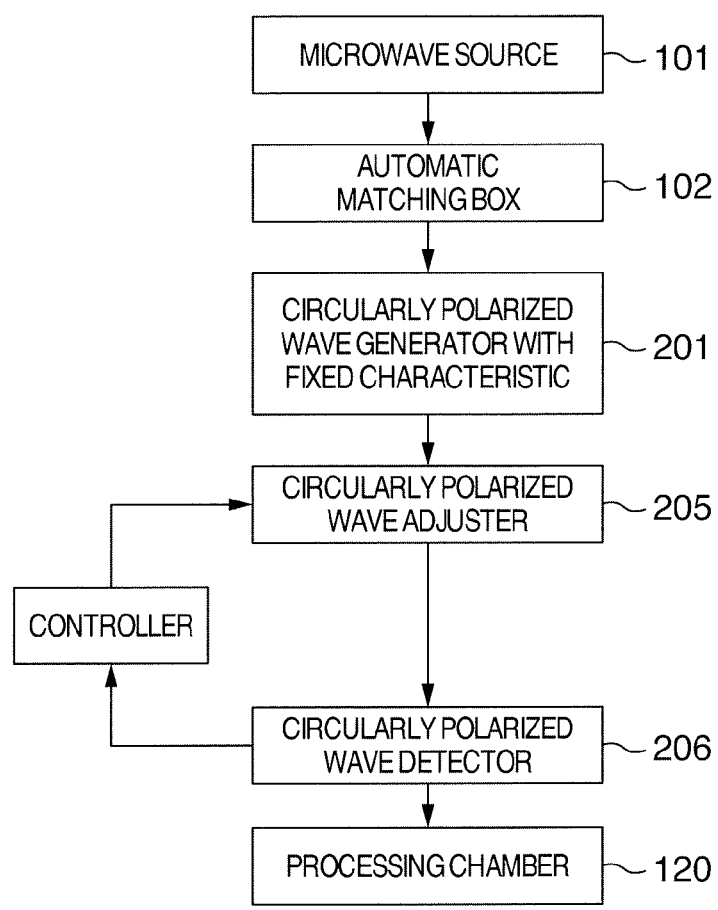
FIG. 11 is a block diagram schematically illustrating a functional configuration of a propagation path of a microwave of the plasma processing apparatus according to the embodiment illustrated in FIG. 1.

FIG. 11 schematically illustrates a functional configuration of the propagation path of the microwave of the plasma processing apparatus of the present embodiment. As illustrated in the figure, the circularly polarized wave detector 206 is arranged between the circularly polarized wave corrector 205 arranged on the circular waveguide 105 of the present embodiment and the processing chamber 120 (or the hollow portion 106); the detection result of the circularly polarized wave detector 206 at the downstream side in the direction into which the electric field of the microwave propagates is transmitted to a controller; using the transmitted output and algorithms described in software recorded in an internal storage device such as a RAM or ROM or in an external storage device such as a CD-ROM, a calculator in the controller calculates the length of the dielectric stubs 203 of the circularly polarized wave corrector 205 to protrude (insertion length) into the inside of the circular waveguide 105, with which desired distribution of the circularly polarized wave in the circumferential direction in the cylinder can be obtained; and the controller transmits a command signal to the circularly polarized wave corrector 205 to obtain this length.

With such a configuration, in the present embodiment, the electric field of the microwave oscillated and generated in the microwave source 101 propagates in the square waveguide 103 having a square section via the automatic matching box 102 and in the circular waveguide 105 via the square-circular waveguide converter 104, and is brought into the circularly polarized wave generator with a fixed characteristic above the circular waveguide 105, so that the circularly polarized wave is generated therebelow. Furthermore, the distribution of the strength of the electric field of the circularly polarized wave in the circumferential direction is corrected by an operation of the driving device depending on the command signals from the control unit transmitted so that the electric field of the circularly polarized wave passes through the circularly polarized wave corrector 205 and the characteristic thereof is adjusted to render the axial ratio of the circularly polarized wave become a desired value, for example, the insertion lengths of the plurality of respective dielectric stubs 203 are calculated by the calculator of the controller and such the lengths are realized to render a ratio of the circularly polarized wave with the axial ratio–1 and the strength of the circularly polarized wave for each angular position or a value of the phase in the circumferential direction become unity or both values accord with each other.

With regard to the electric field of the corrected circularly polarized wave, the strength of the electric field is detected around the axis of the cylinder in the circularly polarized wave detector 206 below, and the axial ratio of the circularly polarized wave is quantified from the result and is transmitted as a signal to the controller connected with the circularly polarized wave detector 206 through a communication unit. The controller transmits command signals calculated using the signal to the circularly polarized wave corrector 205, and adjusts the insertion lengths of the dielectric stubs 203 to control the axial ratio of the circularly polarized wave to be the desired value. The circularly polarized wave corrector 205 operates the driving devices 204 of the dielectric stubs 203 according to the single to move the dielectric stubs 203 to the position where the desired value is realized.

A plasma processing apparatus like the present embodiment frequently processes the film to be processed on the sample to be processed by temporally switching over a plurality of conditions (steps) For example, when etching processing of a silicon film is performed, a surface of the silicon film that is a film to be etched is covered by a very thin natural oxide film and, therefore, in the processing of such a film, a step of a condition, which is suitable for etching of the natural oxide film, is initially performed.

Once removal of the natural oxide film is completed, atoms of silicon are exposed, then, it is switched to a processing step of a condition, which is suitable for them, and the etching processing is performed. Furthermore, when the processing of the silicon film is advanced and a underlying layer of part of it is started to be exposed, in order not to remove a mask material and/or the underlying layer more than necessary, it is switched to a processing step of a condition with a high selectivity against these materials.

Depending on conditions such as the gas used for the etching processing and the power of the electric field of a microwave, and the material and/or the profile of the film to be etched, there are cases where the axial ratio of the circularly polarized wave exerts remarkable influence on the uniformity of the processing and where not. An operation method may be changed depending on influences that the axial ratio of the circularly polarized wave exerts on the uniformity of the processing.

For example, the axial ratio of the circularly polarized wave may be optimally adjusted in the circularly polarized wave corrector 205 in advance, and no adjustment may be performed thereafter so that it may be operated as being semi-fixed. In this case, the circularly polarized wave detectors may be used only for the time of adjustment, and may be omitted when it is employed as being semi-fixed.

Also, an optimal condition for the circularly polarized wave corrector 205 may be obtained for each step in advance, and the optimal conditions may be applied at the time of switching the steps. Furthermore, the axial ratio of the circularly polarized wave may be measured in real time, and the axial ratio may be optimally controlled with the circularly polarized wave corrector 205 on a constant basis.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus comprising:
    a waveguide which is connected with a vacuum vessel, and through which an electric field for plasma generation propagates;
    a generator of the electric field which is connected to the waveguide;
    a circular waveguide which configures the waveguide and is arranged between the generator of the electric field and the vacuum vessel, which has a circular cross-section, and through which a circularly polarized wave of the electric field propagates;
    a processing chamber which is arranged in the vacuum vessel below the circular waveguide, and inside of which the electric field is supplied and the plasma is generated;
    a circularly polarized wave generator which is arranged in the waveguide;
    a circularly polarized wave corrector which is arranged to be connected to the circular waveguide below the circularly polarized wave generator, and which is configured to adjust distribution of the circularly polarized wave in the circular waveguide;
    a circularly polarized wave detector which is configured to detect the distribution of the circularly polarized wave in the circular waveguide below the circularly polarized wave corrector, wherein the circularly polarized wave corrector comprises a plurality of the dielectric stubs inserted in a direction perpendicular to an axis of the circular waveguide; and
    a controller which is configured to adjust an operation of the circularly polarized wave corrector according to an output from the circularly polarized wave detector, and based on a signal from which the circularly polarized wave corrector is configured to adjust a length of each of said dielectric stubs to protrude into the circular waveguide.

2. The plasma processing apparatus according to claim 1, further comprising:
    a matching unit which is arranged between the circularly polarized wave corrector on the waveguide and the generator of the electric field.

3. The plasma processing apparatus according to claim 2, wherein the waveguide comprises a horizontal waveguide which is arranged above the circular waveguide, at a first end portion in an axial direction extending in a horizontal direction of which the generator of the electric field is connected, and at a second end portion of which the circular waveguide is connected, and
    wherein the circularly polarized wave generator is located below a connection portion of the horizontal waveguide and the circular waveguide, and between the connection portion and the circularly polarized wave corrector.

4. The plasma processing apparatus according to claim 1,
    wherein the waveguide comprises a horizontal waveguide which is arranged above the circular waveguide, at a first end portion in an axial direction extending in a horizontal direction of which the generator of the electric field is connected, and at a second end portion of which the circular waveguide is connected, and
    wherein the circularly polarized wave generator is located below a connection portion of the horizontal waveguide and the circular waveguide, and between the connection portion and the circularly polarized wave corrector.

5. A plasma processing apparatus comprising:
    a waveguide which is connected with a vacuum vessel, and through which an electric field for plasma generation propagates;
    a generator of the electric field which is connected to the waveguide;
    a circular waveguide which configures the waveguide and is arranged between the generator of the electric field and the vacuum vessel, which has a circular cross-section, and through which a circularly polarized wave of the electric field propagates;
    a processing chamber which is arranged in the vacuum vessel below the circular waveguide, and inside of which the electric field is supplied and the plasma is generated;
    a circularly polarized wave generator which is arranged in the waveguide;
    a circularly polarized wave corrector which is arranged to be connected to the circular waveguide below the circularly polarized wave generator, and which is configured to adjust distribution of the circularly polarized wave in the circular waveguide;
    a circularly polarized wave detector which is configured to detect the distribution of the circularly polarized wave in the circular waveguide below the circularly polarized wave corrector,
    wherein the circularly polarized wave generator is located below a connection portion of the horizontal waveguide and the circular waveguide, and between the connection portion and the circularly polarized wave corrector; and
    a controller which adjusts an operation of the circularly polarized wave corrector according to an output from the circularly polarized wave detector, and based on a signal from which the circularly polarized wave corrector is configured to adjust a length of each of a plurality of dielectric stubs to protrude into the circular waveguide.

6. The plasma processing apparatus according to claim 5, further comprising:
    a matching unit which is arranged between the circularly polarized wave corrector on the circular waveguide and the generator of the electric field.

7. The plasma processing apparatus according to claim 6, wherein the circularly polarized wave corrector comprises a plurality of the dielectric stubs inserted in a direction perpendicular to an axis of the circular waveguide.

8. The plasma processing apparatus according to claim 5, wherein the circularly polarized wave corrector comprises a plurality of the dielectric stubs inserted in a direction perpendicular to an axis of the circular waveguide.

* * * * *